US006168836B1

(12) United States Patent
Kukanskis et al.

(10) Patent No.: US 6,168,836 B1
(45) Date of Patent: Jan. 2, 2001

(54) PROCESS FOR PLATING UPON A POLYMERIC SURFACE

(75) Inventors: Peter Kukanskis, Woodbury; Steven Castaldi, Torrington; Andrew Krol, Bristol, all of CT (US)

(73) Assignee: MacDermid, Incorporated, Waterbury, CT (US)

( * ) Notice: Under 35 U.S.C. 154(b), the term of this patent shall be extended for 0 days.

(21) Appl. No.: 09/183,137

(22) Filed: Oct. 30, 1998

(51) Int. Cl.[7] .......................................................... C08F 2/48
(52) U.S. Cl. ........................... 427/508; 427/98; 427/383.1; 427/385.5; 427/404; 427/407.1; 427/430.1
(58) Field of Search ..................................... 427/98, 383.1, 427/385.5, 404, 407.1, 430.1, 508

(56) References Cited

U.S. PATENT DOCUMENTS 4,518,646 * 5/1985 Nichols .
4,976,990 * 12/1990 Bach et al. .

FOREIGN PATENT DOCUMENTS 65147 1 * 11/1982 (EP) .
01-121388 * 5/1989 (JP) .

* cited by examiner

Primary Examiner—Bernard Pianalto
(74) Attorney, Agent, or Firm—Carmody & Torrance LLP

(57) ABSTRACT

A process is disclosed for plating upon a polymeric surface with improved adhesion and coverage. The process comprises plating a metallic deposit upon a polymeric surface which has not been completely polymerized and then further curing the plated upon surface.

7 Claims, No Drawings

PROCESS FOR PLATING UPON A POLYMERIC SURFACE

FIELD OF INVENTION

The present invention relates to a process for plating metallic deposits on polymeric surfaces wherein the plated deposits have good adhesion to the polymeric surfaces. The present invention is especially suited to the manufacture of printed circuits of various types. Compositions are proposed which are platable with acceptable adhesion and reliability. The process is useful in forming permanent dielectrics or permanent resists.

BACKGROUND OF THE INVENTION

In general, many processes have been developed to plate upon dielectric or plastic substrates with good adhesion and reliability. Most of these processes have focused on developments in the plating cycle itself to achieve superior plating results. For example, see U.S. Pat. Nos. 5,332,465; 5,132,038; and 4,976,990 the teachings each of which are incorporated herein by reference in their entirety.

The process disclosed herein is useful in plating upon various substrates including, without limitation, plastic (dielectric) parts which are to be plated such as printed circuit boards, faucets, decorative parts, plastic encasements which are to be plated for resistance to electro magnetic radiation, and other functional substrates. As such, the instant invention will be further explained in the context of printed circuit manufacture, but will be seen by those skilled in the art as readily applicable to other similar applications such as the foregoing.

Printed circuit boards utilize a variety of resists in their manufacture. Typically the resists used are of a temporary or non-permanent type, meaning that the resist is used to create an image and then is later stripped from the surface. Various resists of this type are known and used in the art.

Printed circuit board designs using "permanent resists" are also known. A permanent resist is one which is used to create an image on a surface of the printed circuit board and then remains as an integral part of that surface (ie. is not stripped away) and is usually subsequently plated upon. Permanent resists used in the manufacture of printed circuit boards are described in U.S. Pat. No. 3,982,045 issued Sept. 21, 1976 to Kukanskis, the teachings of which are incorporated herein by reference in their entirety. In addition see U.S. Pat. No. 4,882,245 issued to Gelonme et al, the teachings of which are incorporated herein by reference in their entirety. Also see U.S. Pat. Nos. 5,246,817 and 5,322,976, the teachings of which are incorporated herein by reference in their entirety. Shanefield et al., in U.S. Pat. No. 4,444,848, the teachings of which are incorporated herein by reference in their entirety, describes a modified epoxy material which plates with improved adhesion.

Attempts to manufacture useful permanent resists and printed circuit boards and packages using such resists have uncovered a number of difficulties. For a discussion of soldermasks, one type of permanent resist, and their compositions please refer to U.S. Pat. No. 5,296,334, the teaching of which are incorporated herein by reference in their entirety. Among the problems experienced are poor adhesion of the resist to the surface, particularly when temperature cycling is taken into consideration, an ability to obtain suitable photo definability of the resist, poor adhesion of subsequent metal platings to the surface of the resist, inability of the resist to withstand processing in the various subsequent processing chemicals, and/or inability of the resist to provide the appropriate dielectric properties necessary.

A process for plating upon permanent resists with good adhesion would prove very beneficial in the fabrication of printed circuit boards, surface laminar circuitry packages and other important devices. Surface Laminar Circuitry ("SLC") is a technique whereby glass/epoxy laminate, or other substrates such as copper laminates, polyimides and polyetherimides, and a permanent resists are used to produce a structure resembling that of a semiconductor integrated circuit. This technology represents a change in the design concept of multilayer boards, and was developed to meet the requirements caused by the increasing rise of surface mounted devices for high resolution boards with high terminal pitch and enhanced wiring capability. It is an object of the current invention to provide such a process.

SUMMARY OF INVENTION

The invention herein relates to a process for plating upon a polymeric surface comprising:

1. creating a polymeric surface comprising at least one pre-polymer and at least one crosslinking agent;
2. partially, but not fully, polymerizing the surface;
3. plating a metallic deposit upon the partially polymerized surface; and
4. further polymerizing the surface.

The inventors have found that by plating upon a partially polymerized surface and thereafter further polymerizing the surface, excellent adhesion of the plated metallic deposit to the surface is achieved. The inventors have discovered that the best results are achieved if the surface is partially polymerized to a point where from 90–98% of the potential polymerization has occurred, then plated, and subsequently further polymerized.

Detailed Description of the Invention

The inventors herein have surprisingly discovered that excellent adhesion of a plated metal deposit to a polymeric surface can be achieved by first plating upon a partially polymerized surface and then subsequently further polymerizing the surface. Thus the following process is proposed:

1. plating a metallic deposit upon a polymeric surface which surface has not been completely polymerized; and
2. further curing (polymerizing) the plated upon surface. More specifically the following process is proposed:
1. creating a polymeric surface comprising at least one pre-polymer and at least one crosslinking agent;
2. partially, but not fully, polymerizing the surface;
3. plating a metallic deposit upon the partially polymerized surface; and
4. further polymerizing the surface.

The polymeric surfaces to be plated upon can be a wide variety of surfaces with the main requirement being that the surface be only partially polymerized when plated upon and then subsequently further polymerized. The inventors have had particular success with epoxy, epoxy-novolac and polyimide surfaces.

It has been found to be particularly advantageous to formulate the material comprising the polymeric surface such that it partially polymerizes in response to exposure to a certain level of temperature (heat) and/or a particular wave length of radiation and further polymerized in response to exposure to some higher level of temperature (heat). The foregoing is most reasonably accomplished by using two (or more) different pre-polymers and/or crosslinking agents in formulating the composition which comprises the polymeric surface. For example, the surface composition may comprise one pre-polymer and crosslinking agent which polymerize in response to exposure to temperatures of at least 100° C. (or a particular wavelength of radiation of 254 nm ) and another pre-polymer and crosslinking agent which polymerize in response to exposure to temperatures of at least 150° C. Thus the polymeric surface would be subjected to temperatures of 130° C. for a sufficient time to fully polymerize the first pre-polymer and crosslinking agent and thereafter plated upon. Subsequent to plating the polymeric surface would be exposed to temperatures of 1 60° C. for a time to sufficiently polymerize the second pre-polymer and crosslinking agent. It pre-polymer but two crosslinking agents each of which responds to different temperature or wavelengths of radiation.

Alternatively the composition which comprises the polymeric surface may comprise only one pre-polymer or type of pre-polymer and one crosslinking agent or type of crosslinking agent. In this case the composition would merely be subjected to heat and/or radiation, as applicable, to an extent such that the composition is only partially cured. Care must be taken to insure consistency in the amount of cure or polymerization prior to plating. The composition is then plated upon and subsequently further cured.

Examples of suitable pre-polymers include epoxies, epoxy-novolacs, polyimides, acrylics, urethanes and other similar pre-polymers. The inventors have found epoxies, epoxy-novolacs and polyimides to be particularly suitable. Most preferably the pre-polymer includes a mixture of pre-polymers such as mixtures of epoxies and epoxy-novolacs.

The crosslinking agent may also be selected from a variety of suitable candidates such as imidazole derivatives such as 2MZ, 2E4MZ, and 2P4BHZ available from Shikoku Chemicals Corporation of Japan or dicyandiamide available from American Cyanamide Company of Stamford, Conn. Preferably the crosslinking agent includes a mixture of crosslinking agents each of which differs in its response to either heat or radiation. Obviously the crosslinking agents must be chosen so that they are compatible with and effective in polymerizing the pre-polymers under the appropriate conditions.

The composition which comprises the polymeric surface may also comprise other typical additives such as flow modifiers, fillers, colorants, solvents and other performance additives. The skilled artisan will choose and incorporate such additives as are appropriate for the anticipated end use.

The process requires that the polymeric surface be only partially polymerized or cured when plated. The inventors have found that it is preferable for the polymeric surface to be partially cured prior to plating to an extent such that 90–98 percent of the aggregate potential polymerization has occurred prior to plating. As used herein "aggregate potential polymerization" refers to the actual total degree of polymerization which is achievable with any particular composition in practice (as measured by the glass transition point of the material or some other appropriate method such as differential scanning calorimetry) not necessarily the theoretical potential.

After partial polymerization the polymeric surface is then plated. Typical plating processes may be employed. Preferably the process utilizes a dielectric etchant prior to plating. An appropriate plating process would include the following:

1. Solvent Swellent
2. Permanganate Etch
3. Permanganate Reducer
4. Conditioner
5. Activator
6. Accelerator
7. Electroless Metal Deposition Appropriate plating processes are generally described in U.S. Pat. No. 4,976,990.

Subsequent to plating upon the surface the plated upon polymeric surface is subjected to heat to further cure or polymerize the surface. It is preferable that the further polymerization that occurs at this stage not exceed 10 percent of the aggregate potential polymerization so that the surface does not change in such a radical fashion thereby causing the plated metallic deposit to crack.

The process of the proposed invention is further described by the following examples which are intended merely for additional description but are not limiting in any way.

EXAMPLE I

The following composition was prepared:

| Component | Percentage by Weight |
| --- | --- |
| Epon 828[1] | 25.00 |
| Epon 3301[1] | 26.00 |
| ECN 1299[2] | 11.00 |
| Modaflow[3] | 2.30 |
| Di-Hard 100SF[4] | 5.90 |
| Aerosil R-974[5] | 1.00 |
| Curezol 2MA-OK[6] | 0.30 |
| DE Solvent | 28.50 |
| | 100.00 |

Note:
[1]available from Shell Chemical Company
[2]available from Ciba Geigy Corporation
[3]available from Monsanto Chemical Company
[4]available from SKW Corporation
[5]available from Degussa Corporation
[6]available from Air Products Corporation Application of Dielectric:

The composition was coated onto the surface of a clean partial copper coated epoxy/glass laminate using a open 83T monofilament polyester mesh screen. Generally for a 2 mil thick coating two applications are required. First coat is tack dried @77° C.(170° F.) for 15 minutes and the second coat is dried @77° C.(170° F.) for 40 minutes. The coated surface was then baked @ 135° C.(275° F.) for 60 minutes to partially cure the coating.

Plating:

The surface was then plated using the following plating process (cycle):

| Process Step @ | Time (min) | Temperature (° F.) |
| --- | --- | --- |
| 1. Solvent Swellant | 3 | 110 |
| 2. Permanganate Etch | 5 | 165 |
| 3. Permanganate Reducer | 4 | 120 |
| 4. Condition | 5 | 120 |
| 5. Copper Microetch | 2 | 90 |
| 6. Activate | 5 | 90 |
| 7. Accelerate | 2 | 120 |
| 8. Electroless Metal Deposition | 15 | 95 |
| 9. Electrolytic Copper Flash | 5 | 80 |
| 10. Photo-Resist Application | | |
| 11. Pattern Plate Copper | | |
| 12. Pattern Plate Tin | | |

-continued

| Process Step @ | Time (min) | Temperature (° F.) |
|---|---|---|
| 13. Strip the Photo-Resist | | |
| 14. Etch Exposed Copper | | |
| 15. Strip Tin Resist | | |

Note:
Fresh water rinses were interposed between chemical process steps and at the end of processing.

Note:
@ The products used for each of the foregoing process steps are generally known in the plating art and are readily available from several companies including MacDermid, Incorporated of Waterbury, CT.

The plating process is generally described in U.S. Pat. No. 4,976,990. The coated surface was then further baked at 160° C. for 90 minutes to further cure the coating. The adhesion of the plated metal to the permanent dielectric surface was excellent. No blistering or peeling was observed. The adhesion of the plated metal to the dielectric surface was measured to be 8 lbs/in. In addition, the coverage of the dielectric surface with the plated metal was excellent. Substantially no voids in coverage were observed.

Example II

Example I was repeated except that the coated surface was baked at 160° C. for 90 minutes prior to plating to fully cure the coating and no further baking was performed after plating. The adhesion of the plated metal to the permanent dielectric surface was poor. Blistering and peeling were generally observed. The adhesion of the plated metal to the dielectric surface was measured to be 2 lbs/in. In addition the coverage of the dielectric surface with the plated metal was poor, as voids were observed.

What is claimed is:

1. A process for plating upon a polymeric surface said process comprising:

a. creating a polymeric surface comprising at least one pre-polymer and at least one crosslinking agent;

b. partially polymerizing the surface;

c. plating a metallic deposit upon the partially polymerized surface; and d. further polymerizing the surface.

2. A process according to claim 1 wherein the polymeric surface comprises at least two crosslinking agents and wherein at least one crosslinking agent is a thermal crosslinking agent and at least one crosslinking agent is an actinic radiation sensitive crosslinking agent.

3. A process according to claim 2 wherein between 90 and 98 percent of the aggregate potential polymerization has occurred in step (b) and between 2 and 10 percent of the aggregate potential polymerization has occurred in step (d).

4. A process according to claim 1 wherein between 90 and 98 percent of the aggregate potential polymerization has occurred in step (b) and between 2 and 10 percent of the aggregate potential polymerization has occurred in step (d).

5. A process according to claim 1 wherein the polymeric surface comprises at least two crosslinking agents, wherein crosslinking agents are thermal crosslinking agents, and wherein one crosslinking agent is effective to ciosslink at a lower temperature than another crosslinking agent.

6. A process according to claim 5 wherein between 90 and 98 percent of the aggregate potential polymerization has occurred in step (b) and between 2 and 10 percent of the aggregate potential polymerization has occurred in step (d).

7. A process for plating upon a polymeric surface said process comprising plating a metallic deposit upon a polymeric surface which surface has not been completely polymerized and then further polymerizing the plated upon surface.

* * * * *

UNITED STATES PATENT AND TRADEMARK OFFICE
CERTIFICATE OF CORRECTION

PATENT NO. : 6,168,836 B1
DATED : January 2, 2001
INVENTOR(S) : Peter Kukanskis et al.

It is certified that error appears in the above-identified patent and that said Letters Patent is hereby corrected as shown below:

Column 6,
Line 24, delete the word "ciosslink" and insert the word -- crosslink -- in its place.

Signed and Sealed this

Tenth Day of August, 2004

JON W. DUDAS
*Acting Director of the United States Patent and Trademark Office*